United States Patent [19]

Fuchs

[11] Patent Number: 4,833,066
[45] Date of Patent: May 23, 1989

[54] METHOD OF PRODUCING A TRANSFER PRINT

[75] Inventor: Anton Fuchs, Egg, Switzerland

[73] Assignee: Grobena AG, Zurich, Switzerland

[21] Appl. No.: 5,374

[22] Filed: Jan. 12, 1987

Related U.S. Application Data

[63] Continuation-in-part of Ser. No. 770,626, Aug. 28, 1985, abandoned.

[30] Foreign Application Priority Data

Sep. 7, 1984 [DE] Fed. Rep. of Germany ....... 3433012

[51] Int. Cl.⁴ .............................................. G03C 5/00
[52] U.S. Cl. .................................... 430/292; 430/143; 430/293; 430/294; 430/257; 430/271; 430/256; 430/325
[58] Field of Search ............... 430/271, 292, 325, 256, 430/143, 293, 294, 257

[56] References Cited

U.S. PATENT DOCUMENTS 3,671,236 6/1972 Van Beusekom .
4,477,312 10/1984 Czichy ............................. 428/209
4,591,527 5/1986 Czichy ............................. 428/201

FOREIGN PATENT DOCUMENTS 1291960 10/1972 United Kingdom .

Primary Examiner—Jack P. Brammer
Attorney, Agent, or Firm—Toren, McGeady & Associates

[57] ABSTRACT

In producing a transfer print, a lacquer layer is deposited on a substrate and, in turn, a color layer, an adhesive layer, another lacquer layer, a talcum layer and a photo layer are placed on the lacquer layer. After a portion of the photo layer is exposed, the non-exposed areas of the photo layer and the other layers in register with the non-exposed areas are removed. After the exposed area of the photo layer is removed along with selected subjacent layers, the end product includes the substrate and the remaining areas of the lacquer area on the substrate, the color layer and the adhesive layer.

5 Claims, 1 Drawing Sheet

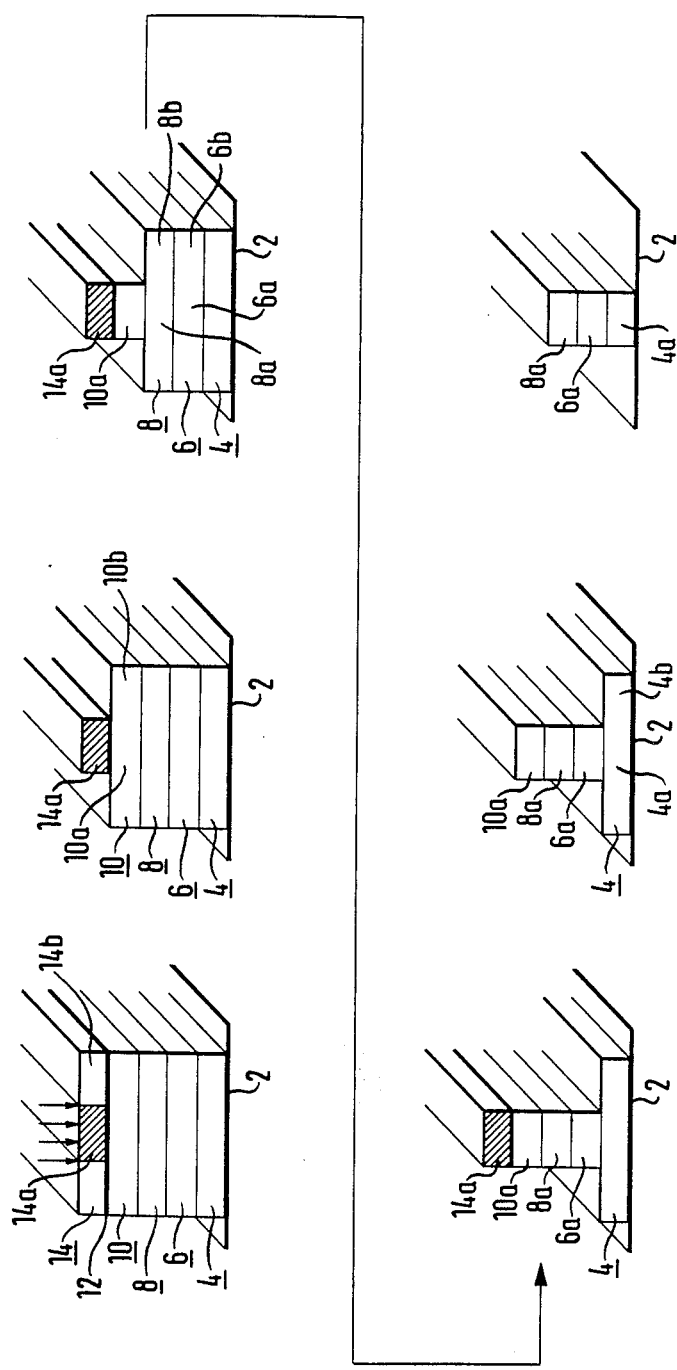

METHOD OF PRODUCING A TRANSFER PRINT

This is a continuation-in-part of application Ser. No. 770,626, filed Aug. 28, 1985, now abandoned.

BACKGROUND OF THE INVENTION

The present invention is directed to a method of producing a transfer print including the steps of applying a color layer onto a substrate and then applying, in turn, an adhesive layer and photo layer. After exposing the selected areas of the photo layer the unexposed areas of the photo layer are removed and then areas of the subjacent layers in register with the unexposed area are removed. The exposed areas of the photo layer are removed leaving the remaining areas of the color layer and the adhesive layer on the substrate which are subsequently placed on a carrier.

In the known method of this general type, the photo layer is applied directly to the adhesive layer. Since the photo layer is usually in a watery condition during application, it wets the adhesive layer in a poor manner. If the photo layer is mixed with a wetting agent to avoid this problem, the wetting agent usually impairs the adhesive character of the adhesive layer.

SUMMARY OF THE INVENTION

The known method is disclosed in U.S. Pat. No. 3,671,236, Great Britain Pat. No. 1,291,960, and German Offenlegungsschrift No. 31 25 239.

Therefore, it is the primary object of the present invention to provide a method affording good adhesion between the photo layer and the adhesive layer whereby a particularly sharp image is achieved.

In accordance with the present invention, a first lacquer layer is applied directly to the substrate before applying the color layer. A second lacquer layer is placed over the adhesive layer before the photo layer is applied. After removing the unexposed areas of the photo layer, the areas of the second lacquer layer in register with the removed areas of the photo layer are also removed. Subsequently, the areas of the first lacquer layer in register with the removed areas of the adhesive layer and the cover layer are removed after the removal of the exposed area of the photo layer. In this final removal step, the area of the second lacquer layer in register with the remaining areas of the color layer and the adhesive layer is removed.

While the application of the lacquer layers represents an increase in costs, as a result, the material of the photo layer cannot penetrate into the adhesive layer nor can the adhesive layer penetrate into the photo layer so that a particularly sharp image is attained.

In accordance with the present invention, the color layer is protected after its application to the carrier without unnecessarily complicating the assembly of the transfer print.

Further, a feature of the invention is that the tint of the color layer is not adversely affected.

It is possible in accordance with the present invention to achieve a favorable removal of the photo layer from the lacquer layer.

The layered body formed in accordance with the invention is made up of the substrate, a first lacquer layer applied directly on the substrate and with the color layer, the adhesive layer, the second lacquer layer, the talcum layer and the photo layer superimposed, in turn, on the first lacquer layer.

These and further features of the invention are pointed out in the claims. Other objects of this invention will become apparent from the following detailed description of a preferred embodiment thereof taken in connection with the accompanying drawings.

BRIEF DESCRIPTION OF THE DRAWING

The drawing is a schematic showing of the method of the present invention illustrating the various steps.

DETAILED DESCRIPTION OF THE INVENTION

Starting with the upper left hand section of the drawing, a substrate 2 formed of silicone paper forms the base and in turn, a lacquer layer 4, a color layer 6, an adhesive layer 8, another lacquer layer 10, a thin talcum powder layer 12, and a photo layer 14 are superimposed on the substrate.

The lacquer layer 4 is soluble in acetone and is based on polyvinylchloride. Color layer 6 is of a polyamide type, such as FLEXOGLOSS made by General Printing, Inc., of Chicago, Ill. The adhesive layer 8 is a pressure sensitive clinging agent such as OPANOL by BASF. The second lacquer layer 10 is the same as the lacquer layer 4. The photolayer 14 is a photo lacquer as used in screen process printing, for instance, ULANO FOTOCOAT 771.

Next, as indicated by the arrows, the photo layer 14 is exposed to light in the area 14a. The unexposed areas 14b located laterally from the area 14a are removed using water in a known manner. Next, the areas 10b of the lacquer layer located below and in register with areas 14b, that is spaced laterally from the exposed areas 14a of the photo layer 14, are removed with acetone. In the next operation, the areas 8b and 6b of the adhesive layer 8 and the photo layer 6 located in register with the areas 10b and laterally outwardly from the areas 8a and 6a located in register with the areas 10a and 14a of the lacquer layer 10 and the photo layer 14, are removed with a mixture of isopropylalcohol. In the following step, the exposed areas 14a of the photo layer 14 are removed in a single step followed by the removal of the areas 4b of the lacquer layer 4 in register with the other removed areas and spaced laterally outwardly from the area 4a of the lacquer layer 4 in register with the area 6a of the color layer 6 the area 8a of the adhesive layer 8 and the area 10a of the lacquer layer 10. Finally, in a single-method step, the area 10a of the lacquer layer 10 and the areas 4b of the lacquer layer 4 are removed so that only the area 4a of the lacquer layer 4, the area 6a of the color layer 6 and the area 8a of the adhesive layer 8 remain on the substrate, that is, the areas 4a, 6a and 8a which originally were in register with the exposed area 14a of the photo layer. This final product can be pressed directly on a carrier by means of the area 8a of the adhesive layer 8 or it can be protected from the carrier using a foil which can be peeled off.

In removing the areas 6b and 8b of the color layer 6 and the adhesive layer 8 the same solvent is used. Further, the same solvent is used in removing the areas 4b, 10b of the two lacquer layers 4, 10. However, the solvent used for removing the areas 6b, 8b is not compatible with the solvent used for removing the areas 4b and 10a.

While embodiments of the invention have been described in detail, it will be evident to those skilled in the art that the invention may be embodied otherwise without departing from its spirit and scope.

I claim:

1. In a method of producing a transfer print comprising the steps of applying a color layer (6) which can be peeled off a substrate, to a substrate (2), applying an adhesive layer (8) on the opposite side of the color layer (6) from the substrate (2), applying a photo layer (14) polymerizable by exposure to light over the adhesive layer (8) on the opposite side thereof from the color layer (6), exposing a selected area (14a) of the photo layer (14), removing unexposed areas (14b) of the photo layer, removing the areas (8b, 6b) of the adhesive layer and the cover layer not in register with the exposed area (14a) of the photo layer (14), removing the exposed area (14a) of the photo layer and placing the substrate (2) and the remaining areas (6a, 8a) of the color layer and the adhesive layer on a carrier, wherein the improvement comprises applying a first lacquer layer (4) to the substrate (2) before applying the color layer (6) so that the first lacquer layer is located between the substrate (2) and the color layer (4), applying a second lacquer layer (10) on said adhesive layer (8) before the application of the photo layer (14) so that the second lacquer layer is located between the adhesive layer (8) and the photo layer (14), removing the areas of the second lacquer layer (10) in register with the removed areas (14b) of the photo layer (14) after the removal of the unexposed areas (14b) of the photo layer (14), removing the areas (4b) of the first lacquer layer (4) in register with the removed areas (8b, 6b) of the adhesive layer (8) and the color layer (6) after the removal of the exposed area (14a) of the photo layer (14) and at the same time in the same removal step removing the area (10a) of the second lacquer layer (10) located in register with the remaining areas (6a, 8a) of the color layer (6) and the adhesive layer (8).

2. Method, as set forth in claim 1, including the step of applying a talcum powder layer (12) on said second layer (10) before applying said photo layer (14).

3. Method, as set forth in claim 1 or 2, including the step of using the same solvent for removing the areas (6b, 8b) of said color layer (6) and of said adhesive layer (8) originally in register with the unexposed areas (14b) of the photo layer (14).

4. Method, as set forth in claim 3, including the step of using the same solvent for removing the area (4b) of the first lacquer layer (4) originally in alignment with the unexposed areas (14a) of the photo layer (14) and the area (10a) of the second lacquer layer (10) originally aligned with the exposed area (14a) of the photo layer (14).

5. Method, as set forth in claim 4, wherein the solvent for removing the areas 6b, 8b of the color layer (6) and of the adhesive layer (8) is not compatible with the solvent used for removing the areas (4b) of the first lacquer area originally in register with the exposed areas (14b) of the photo layer and the area (10a) of the second lacquer layer (10) in register with the exposed areas (14b) of the photo layer (14).

* * * * *